(12) United States Patent
Zhang et al.

(10) Patent No.: US 11,342,355 B2
(45) Date of Patent: May 24, 2022

(54) INTERCONNECT STRUCTURES OF THREE-DIMENSIONAL MEMORY DEVICES

(71) Applicant: YANGTZE MEMORY TECHNOLOGIES CO., LTD., Wuhan (CN)

(72) Inventors: Kun Zhang, Wuhan (CN); Haojie Song, Wuhan (CN); Kun Bao, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/863,006

(22) Filed: Apr. 30, 2020

(65) Prior Publication Data

US 2021/0225864 A1 Jul. 22, 2021

Related U.S. Application Data

(63) Continuation of application No. PCT/CN2020/073458, filed on Jan. 21, 2020.

(51) Int. Cl.
*H01L 27/11582* (2017.01)
*H01L 21/768* (2006.01)
(Continued)

(52) U.S. Cl.
CPC .. *H01L 27/11582* (2013.01); *H01L 21/76805* (2013.01); *H01L 21/76816* (2013.01);
(Continued)

(58) Field of Classification Search
CPC ......... H01L 27/11582; H01L 21/76805; H01L 21/76816; H01L 21/76877;
(Continued)

(56) References Cited

U.S. PATENT DOCUMENTS 9,805,805 B1 10/2017 Zhang et al.
10,083,982 B2 9/2018 Shigemura et al.
(Continued)

FOREIGN PATENT DOCUMENTS

CN 102110690 A 6/2011
CN 108417576 A 8/2018
(Continued)

OTHER PUBLICATIONS

International Search Report issued in corresponding International Application No. PCT/CN2020/073458, dated Oct. 29, 2020, 5 pages.

*Primary Examiner* — Shahed Ahmed
*Assistant Examiner* — Vicki B. Booker
(74) *Attorney, Agent, or Firm* — Bayes PLLC

(57) ABSTRACT

Embodiments of 3D memory devices and methods for forming the same are disclosed. In an example, a 3D memory device includes a substrate, a memory stack, a channel structure, a channel local contact, a slit structure, and a staircase local contact. The memory stack includes interleaved conductive layers and dielectric layers above the substrate. The channel structure extends vertically through the memory stack. The channel local contact is above and in contact with the channel structure. The slit structure extends vertically through the memory stack. The staircase local contact is above and in contact with one of the conductive layers at a staircase structure on an edge of the memory stack. Upper ends of the channel local contact, the slit structure, and the staircase local contact are flush with one another.

20 Claims, 11 Drawing Sheets

(51) Int. Cl.
  *H01L 23/522* (2006.01)
  *H01L 23/528* (2006.01)
  *H01L 23/535* (2006.01)
  *H01L 27/11524* (2017.01)
  *H01L 27/11556* (2017.01)
  *H01L 27/1157* (2017.01)

(52) U.S. Cl.
  CPC .. *H01L 21/76877* (2013.01); *H01L 21/76895* (2013.01); *H01L 23/5226* (2013.01); *H01L 23/5283* (2013.01); *H01L 23/535* (2013.01); *H01L 27/1157* (2013.01); *H01L 27/11524* (2013.01); *H01L 27/11556* (2013.01)

(58) Field of Classification Search
  CPC ........... H01L 21/76895; H01L 23/5226; H01L 23/5283; H01L 23/535; H01L 27/11524; H01L 27/11556; H01L 27/1157
  See application file for complete search history.

(56) References Cited

U.S. PATENT DOCUMENTS

| | | |
|---|---|---|
| 2016/0336306 A1 | 11/2016 | Lee |
| 2017/0092654 A1* | 3/2017 | Nishikawa ........ H01L 29/66545 |
| 2017/0179152 A1 | 6/2017 | Toyama et al. |
| 2019/0067314 A1 | 2/2019 | Lu et al. |
| 2019/0096808 A1 | 3/2019 | Tsutsumi et al. |
| 2019/0326166 A1 | 10/2019 | Nam et al. |

FOREIGN PATENT DOCUMENTS

| | | | |
|---|---|---|---|
| CN | 109155313 A | 1/2019 | |
| CN | 109216366 A | 1/2019 | |
| CN | 109473433 A | 3/2019 | |
| CN | 109844931 A | 6/2019 | |
| CN | 109904166 A | 6/2019 | |
| CN | 110121775 A | 8/2019 | |
| CN | 110520985 A | 11/2019 | |
| WO | 2009123335 A1 | 10/2009 | |
| WO | WO-2018161839 A1 * | 9/2018 | .......... H01L 27/1157 |

* cited by examiner

100

INTERCONNECT STRUCTURES OF THREE-DIMENSIONAL MEMORY DEVICES

CROSS-REFERENCE TO RELATED APPLICATIONS

This application is continuation of International Application No. PCT/CN2020/073458, filed on Jan. 21, 2020, entitled "INTERCONNECT STRUCTURES OF THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack, a channel structure, a channel local contact, a slit structure, and a staircase local contact. The memory stack includes interleaved conductive layers and dielectric layers above the substrate. The channel structure extends vertically through the memory stack. The channel local contact is above and in contact with the channel structure. The slit structure extends vertically through the memory stack. The staircase local contact is above and in contact with one of the conductive layers at a staircase structure on an edge of the memory stack. Upper ends of the channel local contact, the slit structure, and the staircase local contact are flush with one another.

In another example, a 3D memory device includes a substrate, a memory stack, a channel structure, a channel local contact, a slit structure, and a peripherical local contact. The memory stack includes interleaved conductive layers and dielectric layers above the substrate. The channel structure extends vertically through the memory stack. The channel local contact is above and in contact with the channel structure. The slit structure extends vertically through the memory stack. The peripherical local contact extends vertically to the substrate outside of the memory stack. Upper ends of the channel local contact, the slit structure, and the peripherical local contact are flush with one another.

In still another example, a method for forming a 3D memory device is disclosed. Channel structure extending vertically through a dielectric stack including interleaved sacrificial layers and dielectric layers is formed above a substrate. A local dielectric layer is formed on the dielectric stack. A slit opening extending vertically through the local dielectric layer and the dielectric stack is formed. A memory stack including interleaved conductive layers and the dielectric layers is formed by replacing, through the slit opening, the sacrificial layers with the conductive layers. A first source contact portion is formed in the slit opening. A channel local contact opening through the local dielectric layer to expose the channel structure, and a staircase local contact opening through the local dielectric layer to expose one of the conductive layers at a staircase structure on an edge of the memory stack are simultaneously formed. A channel local contact in the channel local contact opening, a second source contact portion above the first source contact portion in the slit opening, and a staircase local contact in the staircase local contact opening are simultaneously formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
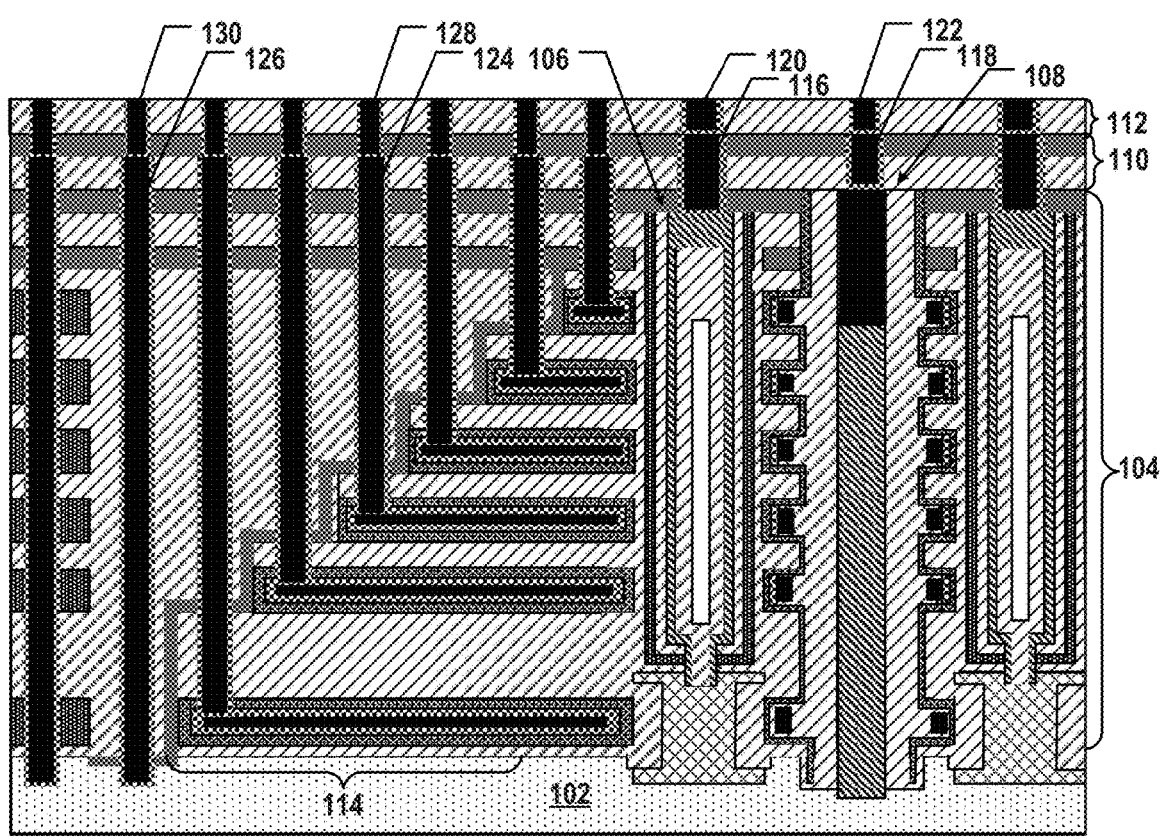
FIG. 1 illustrates a cross-section of a 3D memory device.
Figure 1:
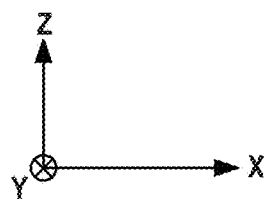

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a slit structure is used for various functions including separating the memory array into multiple blocks, providing access for the etchant and chemical precursor during a gate replacement process, and providing an electrical connection to the source of the memory array. FIG. 1 illustrates a cross-section of a 3D memory device 100. As illustrated in FIG. 1, 3D memory device 100 includes a memory stack 104 above a substrate 102. 3D memory device 100 also includes an array of channel structures 106 and a slit structure 108 each extending vertically through memory stack 104. Each channel structure 106 functions as a NAND memory string, and slit structure 108 functions as an electrical connection to the source of the NAND memory string, for example, an array common source (ACS) of an array of channel structures 106.

3D memory device 100 further includes an interconnect structure for channel structure 106 and slit structure 108 above memory stack 104, which includes a local contact layer 110 on memory stack 104, and an interconnect layer 112 on local contact layer 110. It is noted that x-, y-, and z-axes are included in FIG. 1 to illustrate the spatial relationships of the components in 3D memory device 100. Substrate 102 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationships is applied throughout the present disclosure.

Local contact layer 110 includes local contacts (also known as "C1") that are in contact with a structure in memory stack 104 directly, including a channel local contact 116 in contact with channel structure 106 and a slit local contact 118 in contact with slit structure 108. In some embodiments, 3D memory device 100 includes additional local contacts, such as staircase local contacts 124 each in contact with a respective one of the word lines in a staircase structure 114 at the edge of memory stack 104 as well as peripheral local contacts 126 in contact with substrate 102 outside of memory stack 104. Interconnect layer 112 includes contacts (also known as "V0") that are in contact with local contact layer 110, such as channel contacts 120 in contact with channel local contacts 116, respectively, a slit contact 122 in contact with slit local contact 118, staircase contacts 128 in contact with staircase local contacts 124, respectively, and peripheral contacts 130 in contact with peripheral local contacts 126, respectively.

In 3D memory device 100, channel local contacts 116 and slit local contact 118 have different depths, different critical dimensions, and land on different materials (e.g., channel local contact 116 lands on a polysilicon plug of channel structure 106, while slit local contact 118 lands on a tungsten source contact of slit structure 108), which makes the fabrication of local contact layer 110 more challenging. Moreover, as the upper ends of different types of local contacts (e g, channel local contact 116, slit local contact 118, staircase local contact 124, and peripheral local contact 126) are not flush with one another (i.e., not aligned in the z-direction), different types of contacts in interconnect layer 112 (e.g., channel contact 120, slit contact 122, staircase contact 128, and peripheral contact 130) have different depths, which further increases the complexity of fabricating the interconnect structure.

Various embodiments in accordance with the present disclosure provide 3D memory devices with improved interconnect structures. By removing the slit local contacts and merging the metal deposition steps of slit source contacts and various types of local contacts, e.g., channel local contacts, staircase local contacts, and/or peripheral local contacts, the process cycle time and fabrication cost can be reduced, with increased yield. Moreover, as the upper ends of the slit source contacts and various types of local contacts can be flush with one another, different types of V0 contacts in the interconnect structure can have the same depth and land on the same type of material, making the fabrication process less challenging as well.

Figure 2:
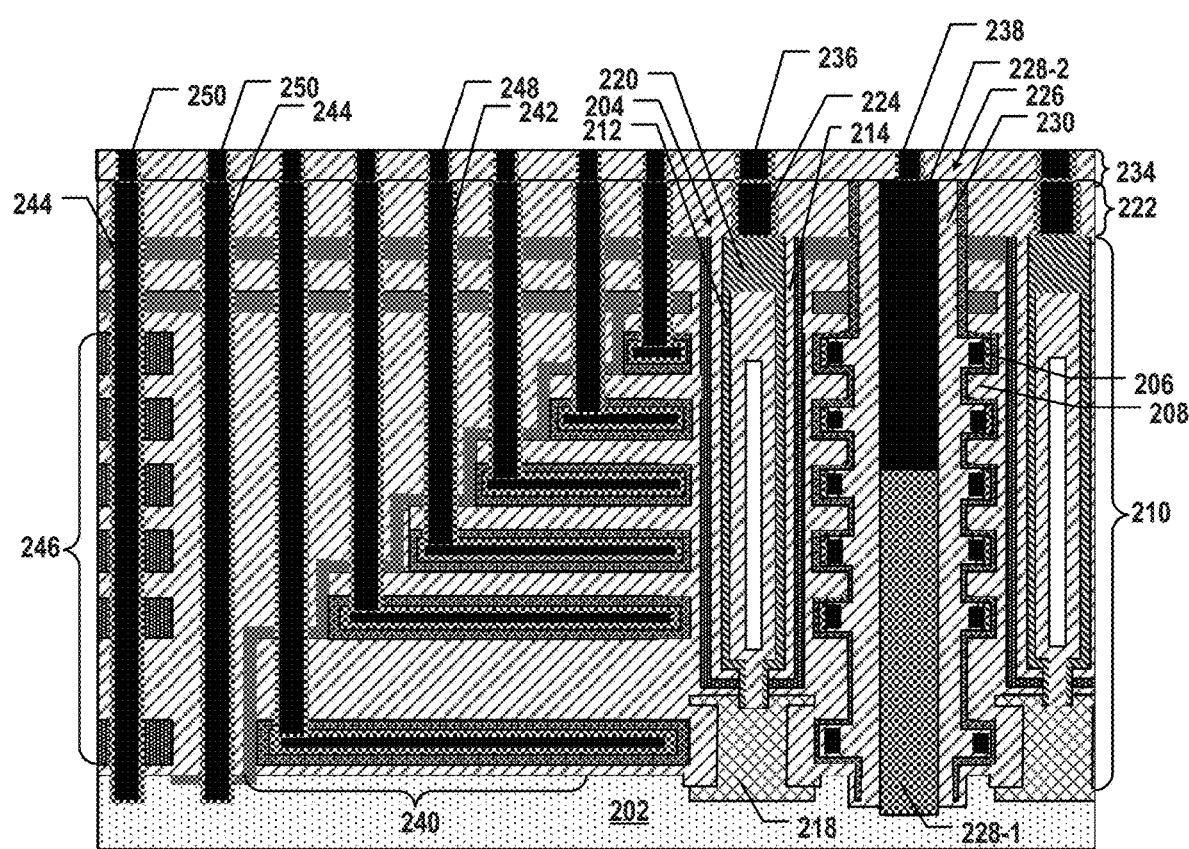
FIG. 2 illustrates a cross-section of an exemplary 3D memory device with an interconnect structure, according to some embodiments of the present disclosure.

FIG. 2 illustrates a cross-section of an exemplary 3D memory device 200 with an interconnect structure, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings each extending vertically above substrate 202. The memory array device can include an array of channel structures 204 functioning as the array of NAND memory strings. As shown in FIG. 2, channel structure 204 can extend vertically through a plurality of pairs each including a conductive layer 206 and a dielectric layer 208. The interleaved conductive layers 206 and dielectric layers 208 are part of a memory stack 210. The number of the pairs of conductive layers 206 and dielectric layers 208 in memory stack 210 (e.g., 32, 64, 96, or 128) determines the number of memory cells in 3D memory device 200. It is understood that in some embodiments, memory stack 210 may have a multi-deck architecture (not shown), which includes a plurality of memory decks stacked over one another. The numbers of the pairs of conductive layers 206 and dielectric layers 208 in each memory deck can be the same or different.

Memory stack 210 can include a plurality of interleaved conductive layers 206 and dielectric layers 208. Conductive layers 206 and dielectric layers 208 in memory stack 210 can alternate in the vertical direction. In other words, except the ones at the top or bottom of memory stack 210, each conductive layer 206 can be adjoined by two dielectric layers 208 on both sides, and each dielectric layer 208 can be adjoined by two conductive layers 206 on both sides. Conductive layers 206 can include conductive materials including, but not limited to, tungsten (W), cobalt (Co), copper (Cu), aluminum (Al), polysilicon, doped silicon, silicides, or any combination thereof. Each conductive layer 206 can be a gate electrode (gate line) surrounding channel structure 204 and can extend laterally as a word line. Dielectric layers 208 can include dielectric materials including, but not limited to, silicon oxide, silicon nitride, silicon oxynitride, or any combination thereof. It is understood that a silicon oxide film, such as an in-situ steam generation (ISSG) silicon oxide, may be formed between substrate 202 (e.g., a silicon substrate) and memory stack 210, according to some embodiments.

As shown in FIG. 2, channel structure 204 can include a channel hole filled with a semiconductor layer (e.g., as a semiconductor channel 212) and a composite dielectric layer (e.g., as a memory film 214). In some embodiments, semiconductor channel 212 includes silicon, such as amorphous silicon, polysilicon, or single-crystal silicon. In some embodiments, memory film 214 is a composite layer including a tunneling layer, a storage layer (also known as a "charge trap layer"), and a blocking layer. The remaining space of channel structure 204 can be partially or fully filled with a capping layer including dielectric materials, such as silicon oxide, and/or an air gap. Channel structure 204 can have a cylinder shape (e.g., a pillar shape). The capping layer, semiconductor channel 212, the tunneling layer, storage layer, and blocking layer of memory film 214 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 214 can include a composite layer of silicon oxide/silicon oxynitride/silicon oxide (ONO).

In some embodiments, channel structure 204 further includes a semiconductor plug 218 in the bottom portion (e.g., at the lower end) of channel structure 204. As used herein, the "upper end" of a component (e.g., channel structure 204) is the end farther away from substrate 202 in the y-direction, and the "lower end" of the component (e.g., channel structure 204) is the end closer to substrate 202 in the y-direction when substrate 202 is positioned in the lowest plane of 3D memory device 200. Semiconductor plug 218 can include a semiconductor material, such as silicon, which is epitaxially grown from substrate 202 in any suitable directions. It is understood that in some embodiments, semiconductor plug 218 includes single-crystal silicon, the same material of substrate 202. In other words, semiconductor plug 218 can include an epitaxially-grown semiconductor layer that is the same material as substrate 202. Semiconductor plug 218 can be below and in contact with the lower end of semiconductor channel 212. Semiconductor plug 218 can function as a channel controlled by a source select gate of the NAND memory string.

In some embodiments, channel structure 204 further includes a channel plug 220 in the top portion (e.g., at the upper end) of channel structure 204. Channel plug 220 can be above and in contact with the upper end of semiconductor channel 212. Channel plug 220 can include semiconductor materials (e.g., polysilicon). By covering the upper end of channel structure 204 during the fabrication of 3D memory device 200, channel plug 220 can function as an etch stop layer to prevent etching of dielectrics filled in channel structure 204, such as silicon oxide and silicon nitride. In some embodiments, channel plug 220 can function as the drain of the NAND memory string.

As shown in FIG. 2, 3D memory device 200 also includes a local contact layer 222 on memory stack 210 as part of the interconnect structure. In some embodiments, local contact layer 222 is formed on top of the upper end of channel structure 204 (i.e., channel plug 220). Local contact layer 222 can include a plurality of interconnects (also referred to herein as "contacts"), including lateral interconnect lines and via contacts. As used herein, the term "interconnects" can broadly include any suitable types of interconnects, such as middle-end-of-line (MEOL) interconnects and back-end-of-line (BEOL) interconnects. The interconnects in local contact layer 222 are referred to herein as "local contacts" (also known as "C 1"), which are in contact with a structure in memory stack 210 directly. In some embodiments, local contact layer 222 includes a channel local contact 224 above and in contact with the upper end of channel structure 204 (e.g., channel plug 220).

Local contact layer 222 can further include one or more interlayer dielectric (ILD) layers (also known as "intermetal dielectric (IMD) layers") in which the local contacts (e.g., channel local contact 224) can form. In some embodiments, local contact layer 222 includes channel local contact 224 in one or more local dielectric layers. Channel local contact 224 in local contact layer 222 can include conductive materials including, but not limited to, Cu, Al, W, Co, silicides, or any combination thereof. In one example, channel local contact 224 is made of tungsten. The ILD layers in local contact layer 222 can include dielectric materials including, but not limited to, silicon oxide, silicon nitride, silicon oxynitride, low dielectric constant (low-k) dielectrics, or any combination thereof.

As shown in FIG. 2, 3D memory device 200 further includes a slit structure 226 extending vertically through local contact layer 222 and interleaved conductive layers 206 and dielectric layers 208 of memory stack 210. Slit structure 226 can also extend laterally (e.g., in the bit line direction/y-direction in FIG. 2) to separate memory stack 210 into multiple blocks. Slit structure 226 can include a slit opening that provides access for the chemical precursor to form conductive layers 206. In some embodiments, slit structure 226 also includes a doped region (not shown) at its lower end in substrate 202 to reduce the resistance of the electrical connection with the ACS.

In some embodiments, slit structure 226 further includes a source contact 228 for electrically connecting the ACS of the NAND memory strings to the interconnect structures, such as source lines (not shown). In some embodiments, source contact 228 includes a wall-shaped contact. As shown in FIG. 2, source contact 228 can include a lower source contact portion 228-1 in the bottom portion of slit structure 226 (e.g., in contact with the doped region) and an upper source contact portion 228-2 in the top portion of slit structure 226. In some embodiments, upper source contact portion 228-2 is above and in contact with lower source contact portion 228-1 and has a different material of lower source contact portion 228-1. Lower source contact portion 228-1 can include a conductive material, such as doped polysilicon, to reduce the contact resistance with the doped region. Upper source contact portion 228-2 can include conductive materials, such as a metal including, but not limited to, W, Co, Cu, Al, or any combination thereof. In one example, upper source contact portion 228-2 may include tungsten. As described below in detail, as the conductive materials of channel local contacts 224 and upper source contact portion 228-2 of slit structure 226 can be deposited in the same process, upper source contact portion 228-2 and channel local contacts 224 include the same conductive material, such as the same metal. In one example, the metal may include tungsten.

To electrically insulate source contact 228 of slit structure 226 from conductive layers 206 of memory stack 210, slit structure 226 can further include a spacer 230 disposed along the sidewall of the slit opening and in etch-back recesses abutting the sidewall of the slit opening. That is, spacer 230 can be formed laterally between source contact 228 and conductive layers 206 of memory stack 210. Spacer 230 can include one or more layers of dielectric materials, such as silicon oxide, silicon nitride, silicon oxynitride, or any combination thereof.

As shown in FIG. 2, on at least one edge in the lateral direction (the x-direction and/or y-direction), memory stack 210 can include a staircase structure 240. In staircase structure 240, corresponding edges of conductor/dielectric layer pairs along the vertical direction (the z-direction in FIG. 2) can be staggered laterally for word line fan-out. Each "level" of staircase structure 240 can include one or more conductor/dielectric layer pairs, each including a pair of conductive layer 206 (extending laterally in the x-direction as the word lines) and dielectric layer 208. In some embodiments, the top layer in each level of staircase structure 240 is one of conductive layers 206 for interconnection in the vertical directions (e.g., word line fan-out). In some embodiments, every two adjacent levels of staircase structure 240 are offset by a nominally same distance in the vertical direction and a nominally same distance in the lateral direction. Each offset thus can form a "landing area" for interconnection with the word lines of 3D memory device 200 in the vertical direction.

In some embodiments, 3D memory device 200 further includes staircase local contacts 242 (also known as "word line local contacts") each above and in contact with a respective one of conductive layers (word line) 206 at staircase structure 240 of memory stack 210. Each staircase local contact 242 can extend vertically through the ILD layers in local contact layer 222 and further through the ILD layer covering staircase structure 240 to reach to a respective conductive layer (word line) 206 on the edge of memory stack 210. Staircase local contacts 242 can include conductive materials, such as a metal including, but not limited to, W, Co, Cu, Al, or any combination thereof. In one example, staircase local contact 242 may include tungsten.

In some embodiments, 3D memory device 200 further includes peripheral local contacts 244 each extending vertically to substrate 202 outside of memory stack 210. Each peripheral local contact 244 can have a depth greater than the depth of memory stack 210 to extend vertically from local contact layer 222 to substrate 202 in a peripheral region that is outside of memory stack 210. In some embodiments, peripheral local contact 244 is above and in contact with a peripheral circuit (not shown) or a doped region (a P-well or N-well, not shown) in substrate 202 for transferring electrical signals to and/or from the peripheral circuit or the doped region. In some embodiments, the peripheral circuits include any suitable digital, analog, and/or mixed-signal peripheral circuits used for facilitating the operation of 3D memory device 200. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors, etc.). Peripheral local contacts 244 can include conductive materials, such as a metal including, but not limited to, W, Co, Cu, Al, or any combination thereof. In one example, peripheral local contact 244 may include tungsten.

In some embodiments, 3D memory device 200 further includes a barrier structure 246 including interleaved first dielectric layers and second dielectric layers having different dielectric materials. For example, the dielectric materials of first and second dielectric layers may be silicon oxide and silicon nitride, respectively. In some embodiments, the first and second dielectric layers of barrier structure 246 are the same as those forming a dielectric stack that eventually becomes memory stack 210 after the gate replacement process as described below in detail. In some embodiments, one or more of peripheral local contacts 244 extend through barrier structure 246. That is, barrier structure 246 can surround peripheral local contact 244 as a barrier that separates peripheral local contact 244 from other nearby structures. In some embodiments, peripheral local contact 244 includes a via contact, as opposed to a wall-shaped contact. It is understood that although peripheral local contacts 244 (with or without barrier structure 246 surrounded) locate in the peripheral region outside of memory stack 210 as shown in FIG. 2, in some embodiments, one or more peripheral local contacts 244 (with or without barrier structure 246 surrounded) may be formed within memory stack 210, also known as "through array contacts" (TACs).

Different from 3D memory device 100 in FIG. 1, which includes slit local contact 118 in local contact layer 110 above and in contact with slit structure 108, 3D memory device 200 in FIG. 2 does not include a slit local contact in local contact layer 222. Instead, slit structure 226 (and upper source contact portion 228-2 therein) can extend vertically further through local contact layer 222. By replacing the slit local contact with a continues, wall-type contact (e.g., source contact 228), the overlay control for the local contacts in local contact layer 222 can be simplified, and the resistance of the interconnect structure can be reduced. Moreover, the upper end of slit structure 226 (and upper source contact portion 228-2 therein) can be flush with the upper end of each of the local contacts including channel local contact 224, staircase local contact 242, and peripheral local contact 244, e.g., in the same plane after the same planarization process as described below in detail. That is, the upper ends of channel local contact 224, slit structure 226, staircase local contact 242, and peripheral local contact 244 are flush with one another, according to some embodiments. In some embodiments, upper source contact portion 228-2, channel local contact 224, staircase local contact 242, and peripheral local contact 244 include the same conductive material, e.g., deposited by the same deposition process as described below in detail. For example, upper source contact portion 228-2, channel local contact 224, staircase local contact 242, and peripheral local contact 244 include the same metal, such as tungsten. The design of the local contacts of 3D memory device 200 in FIG. 2 can thus simplify the fabrication process and reduce the cost and process cycle.

As shown in FIG. 2, 3D memory device 200 also includes an interconnect layer 234 on local contact layer 222 as part of the interconnect structure. Interconnect layer 234 can include a plurality of via contacts (also known as "V0"), such as channel contacts 236 each above and in contact with the upper end of a respective one of channel local contacts 224 and a slit contact 238 above and in contact with the upper end of slit structure 226 (e.g., upper source contact portion 228-2 therein). In some embodiments, interconnect layer 234 further includes staircase contacts 248 (also known as "word line contacts") each above and in contact with the upper end of a respective one of staircase local contact 242, and peripheral contacts 250 each above and in contact with the upper end of a respective one of peripheral local contact 244. Interconnect layer 234 can further include one or more ILD layers in which channel contact 236, slit contact 238, staircase contact 248, and peripheral contact 250 can form. That is, interconnect layer 234 can include channel contact 236, slit contact 238, staircase contact 248, and peripheral contact 250 in one or more first dielectric layers. Channel contact 236, slit contact 238, staircase contact 248, and peripheral contact 250 in interconnect layer 234 can include conductive materials including, but not limited to, Cu, Al, W, Co, silicides, or any combination thereof. The ILD layers in interconnect layer 234 can include dielectric materials including, but not limited to, silicon oxide, silicon nitride, silicon oxynitride, low-k dielectrics, or any combination thereof.

Different from 3D memory device 100 in FIG. 1 in which the contacts in interconnect layer 112 have different depths, the various types of contacts (e g, channel contact 236, slit contact 238, staircase contact 248, and peripheral contact 250) in interconnect layer 234 of 3D memory device 200 in FIG. 2 have the same depth. In some embodiments, the upper ends of channel contact 236, slit contact 238, staircase contact 248, and peripheral contact 250 are flush with one another, and the lower ends of channel contact 236, slit contact 238, staircase contact 248, and peripheral contact 250 are flush with one another as well. As a result, the fabrication process for forming interconnect layer 234 can be less challenging. As described below in detail, the same deposition and planarization processes can be used to form the various types of contacts (e.g., channel contact 236, slit contact 238, staircase contact 248, and peripheral contact 250) in interconnect layer 234. Thus, channel contact 236, slit contact 238, staircase contact 248, and peripheral contact 250 can have the same conductive materials, such as tungsten.

It is to be understood that the number of interconnect layers in 3D memory device 200 is not limited by the example in FIG. 2. Additional interconnect layer(s) can be formed to provide desired interconnect structures of 3D memory device 200. Nevertheless, local contact layer 222 and interconnect layer 234 form interconnect structures for transferring electrical signals from and/or to channel structure 204, slit structure 226, conductive layers (word lines) 206, and peripheral circuits/doped regions (not shown) in substrate 202.

Figure 3A:
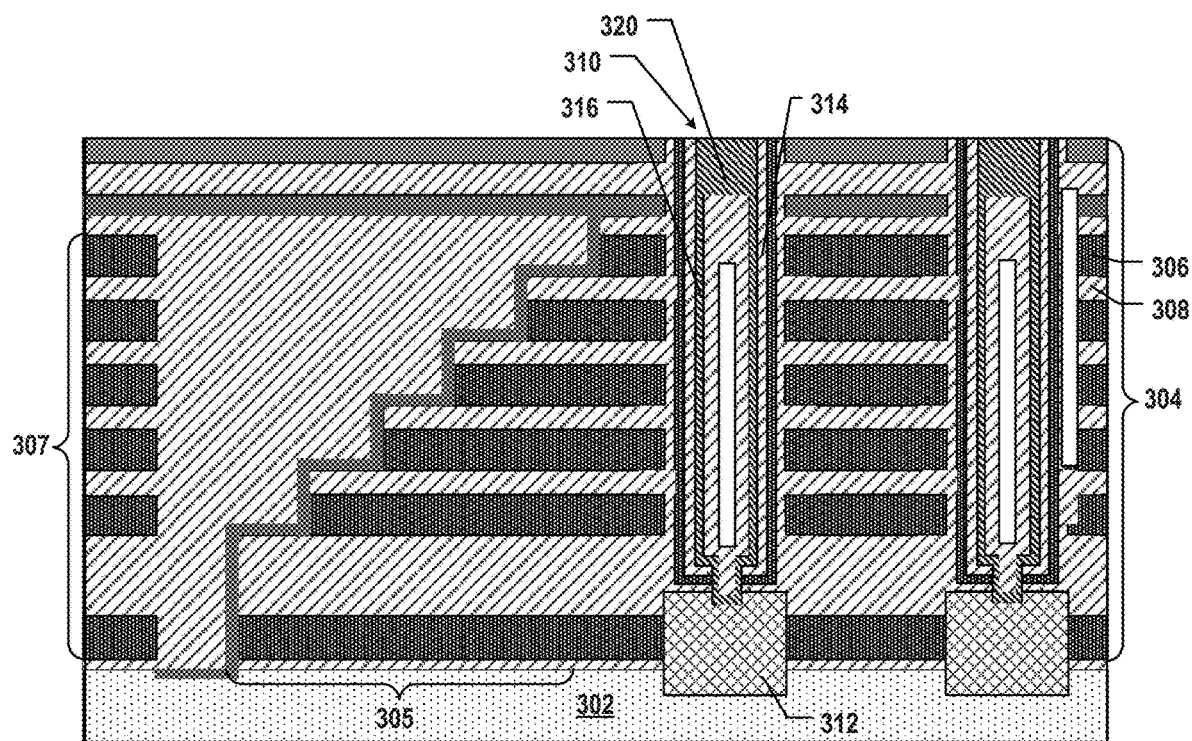
FIGS. 3A-3H illustrate a fabrication process for forming an exemplary 3D memory device with an interconnect structure, according to some embodiments of the present disclosure.
Figure 3A:
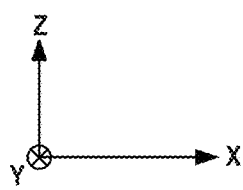
Figure 3B:
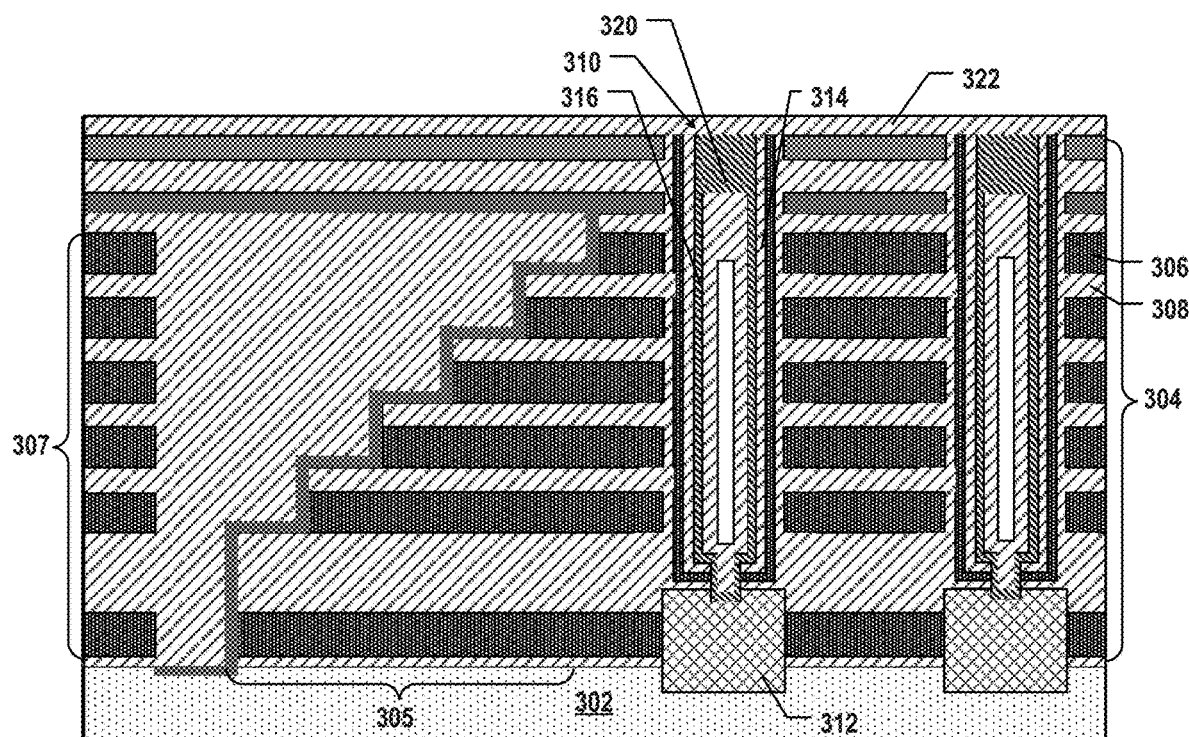
Figure 3B:
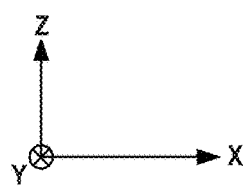
Figure 3C:
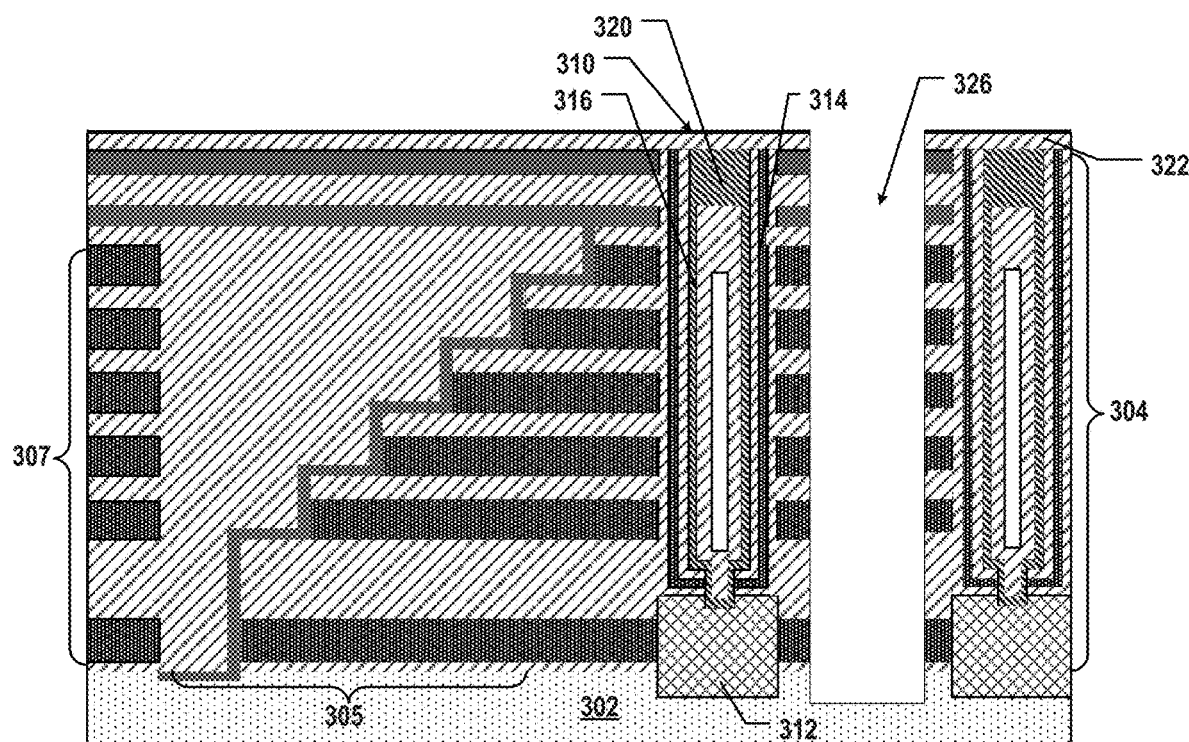
Figure 3C:
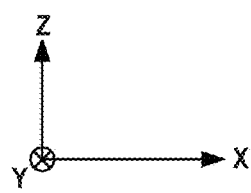
Figure 3D:
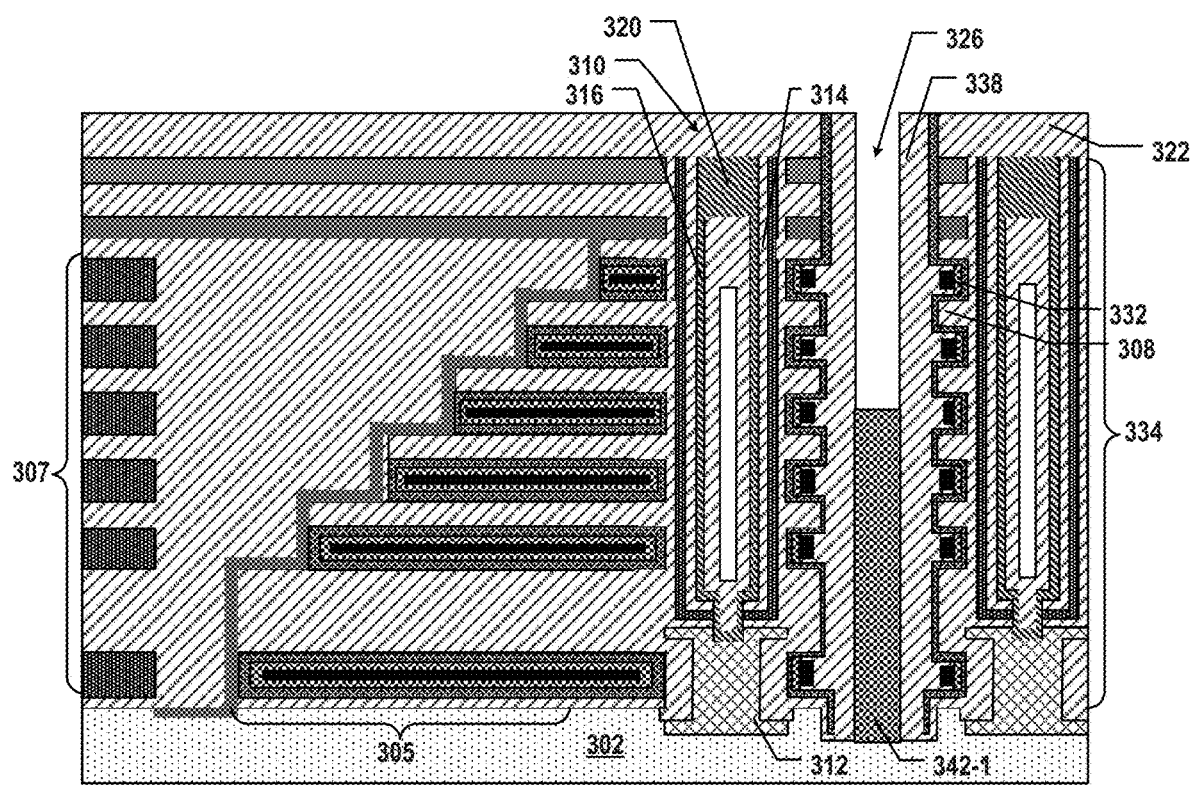

FIGS. 3A-3H illustrate a fabrication process for forming an exemplary 3D memory device with an interconnect structure, according to some embodiments of the present disclosure. FIG. 4 illustrates a flowchart of a method 400 for forming an exemplary 3D memory device with an interconnect structure, according to some embodiments of the present disclosure. Examples of the 3D memory device depicted in FIGS. 3A-3H and 4 include 3D memory device 200 depicted in FIG. 2. FIGS. 3A-3H and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a dielectric stack including interleaved sacrificial layers and dielectric layers above a substrate. The substrate can be a silicon substrate. Referring to FIG. 3A, a dielectric stack 304 including a plurality pairs of a sacrificial layer 306 and a dielectric layer 308 (dielectric/sacrificial layer pairs) is formed above a silicon substrate 302. Dielectric stack 304 includes interleaved sacrificial layers 306 and dielectric layers 308, according to some embodiments. Dielectric layers 308 and sacrificial layers 306 can be alternatingly deposited on silicon substrate 302 to form dielectric stack 304. In some embodiments, each dielectric layer 308 includes a layer of silicon oxide, and each sacrificial layer 306 includes a layer of silicon nitride. That is, a plurality of silicon nitride layers and a plurality of silicon oxide layers can be alternatingly deposited above silicon substrate 302 to form dielectric stack 304. In some embodiments, a barrier structure 307 including interleaved first dielectric layers and second dielectric layers is formed outside of dielectric stack 304 above silicon substrate 302. First and second dielectric layers of barrier structure 307 can include the same materials as sacrificial layers 306 and dielectric layers 308 of dielectric stack 304, respectively. Dielectric stack 304 and barrier structure 307 can be formed together by one or more thin film deposition processes including, but not limited to, chemical vapor deposition (CVD), physical vapor deposition (PVD), atomic layer deposition (ALD), or any combination thereof.

As illustrated in FIG. 3A, a staircase structure 305 can be formed on the edge of dielectric stack 304. Staircase structure 305 can be formed by performing a plurality of so-called "trim-etch" cycles for the dielectric/sacrificial layer pairs of dielectric stack 304 toward silicon substrate 302. Due to the repeated trim-etch cycles for the dielectric/sacrificial layer pairs of dielectric stack 304, dielectric stack 304 can have a tilted edge and a top dielectric/sacrificial layer pair shorter than the bottom one, as shown in FIG. 3A.

Method 400 proceeds to operation 404, as illustrated in FIG. 4, in which a channel structure extending vertically through the dielectric stack is formed. In some embodiments, to form the channel structure, a channel hole extending vertically through the dielectric stack is formed, a memory film and a semiconductor channel are subsequently formed over a sidewall of the channel hole, and a channel plug is formed above and in contact with the semiconductor channel.

As illustrated in FIG. 3A, a channel hole is an opening extending vertically through dielectric stack 304. In some embodiments, a plurality of openings are formed through dielectric stack 304 such that each opening becomes the location for growing an individual channel structure 310 in the later process. In some embodiments, fabrication processes for forming the channel hole of channel structure 310 include wet etching and/or dry etching, such as deep-ion reactive etching (DRIE). In some embodiments, the channel hole of channel structure 310 extends further through the top portion of silicon substrate 302. The etching process through dielectric stack 304 may not stop at the top surface of silicon substrate 302 and may continue to etch part of silicon substrate 302. As illustrated in FIG. 3A, a semiconductor plug 312 can be formed by filling the bottom portion of the channel hole with single-crystal silicon epitaxially grown from silicon substrate 302 in any suitable directions (e.g., from the bottom surface and/or side surface). The fabrication processes for epitaxially growing semiconductor plug 312 can include, but not limited to, vapor-phase epitaxy (VPE), liquid-phase epitaxy (LPE), molecular-beam epitaxy (MPE), or any combinations thereof.

As illustrated in FIG. 3A, a memory film 314 (including a blocking layer, a storage layer, and a tunneling layer) and a semiconductor channel 316 are formed along the sidewall of the channel hole of channel structure 310 and above semiconductor plug 312. In some embodiments, memory film 314 is first deposited along the sidewall of the channel hole and above semiconductor plug 312, and semiconductor channel 316 is then deposited over memory film 314. The blocking layer, storage layer, and tunneling layer can be subsequently deposited in this order using one or more thin film deposition processes, such as ALD, CVD, PVD, any other suitable processes, or any combination thereof, to form memory film 314. Semiconductor channel 316 can then be formed by depositing polysilicon on the tunneling layer using one or more thin film deposition processes, such as ALD, CVD, PVD, any other suitable processes, or any combination thereof. Semiconductor channel 316 can be in contact with semiconductor plug 312 using, for example, a SONO punch process. In some embodiments, semiconductor channel 316 is deposited in the channel hole without completely filling the channel hole. In some embodiments, a capping layer, such as a silicon oxide layer, is formed in the channel hole to fully or partially fill the remaining space of the channel hole using one or more thin film deposition processes, such as CVD, PVD, ALD, electroplating, electroless plating, or any combination thereof.

As illustrated in FIG. 3A, a channel plug 320 is formed in the top portion of the channel hole of channel structure 310. In some embodiments, parts of memory film 314, semiconductor channel 316, and the capping layer that are on the top surface of dielectric stack 304 are removed and planarized by CMP, wet etching and/or dry etching. A recess then can be formed in the top portion of the channel hole by wet etching and/or drying etching parts of semiconductor channel 316 and the capping layer in the top portion of the channel hole. Channel plug 320 then can be formed by depositing semiconductor materials, such as polysilicon, into the recess by one or more thin film deposition processes, such as CVD, PVD, ALD, electroplating, electroless plating, or any combination thereof. Channel structure 310 is thereby formed through dielectric stack 304.

Method 400 proceeds to operation 406, as illustrated in FIG. 4, in which a local dielectric layer is formed on the dielectric stack. The local dielectric layer is part of the interconnect structure of the final 3D memory device to be formed. As illustrated in FIG. 3B, a local dielectric layer 322 is formed on dielectric stack 304. Local dielectric layer 322 can be formed by depositing dielectric materials, such as silicon oxide and/or silicon nitride, using one or more thin film deposition processes, such as CVD, PVD, ALD, or any combination thereof, on top of the top surface of dielectric stack 304.

Method 400 proceeds to operation 408, as illustrated in FIG. 4, in which a slit opening extending vertically through the local dielectric layer and the dielectric stack is formed. As illustrated in FIG. 3C, a slit opening 326 is formed using wet etching and/or dry etching, such as DRIE. In some embodiments, the etching process etches slit opening 326 through local dielectric layer 322 and interleaved sacrificial layers 306 and dielectric layers 308 (e.g., silicon nitride layers and silicon oxide layers) of dielectric stack 304 to reach silicon substrate 302. Slit opening 326 can be patterned by an etching mask (e.g., photoresist) using photolithography, such that slit opening 326 is to be formed at the place where a slit structure is to be formed.

Method 400 proceeds to operation 410, as illustrated in FIG. 4, in which a memory stack including interleaved conductive layers and the dielectric layers is formed by replacing, through the slit opening, the sacrificial layers with the conductive layers (i.e., the so-called "gate replacement" process). As illustrated in FIG. 3D, sacrificial layers 306 (shown in FIG. 3B) are replaced with conductive layers 332, and a memory stack 334 including interleaved conductive layers 332 and dielectric layers 308 is thereby formed. It is understood that the gate replacement process may not affect barrier structure 307, which still includes the interleaved first and second dielectric layers afterward and in the final 3D memory device.

In some embodiments, lateral recesses (not shown) are first formed by removing sacrificial layers 306 through slit opening 326. In some embodiments, sacrificial layers 306 are removed by applying etching solutions through slit opening 326, such that sacrificial layers 306 are removed, creating the lateral recesses interleaved between dielectric layers 308. The etching solutions can include any suitable etchants that etch sacrificial layers 306 selective to dielectric layers 308. As illustrated in FIG. 3D, conductive layers 332 are deposited into the lateral recesses through slit opening 326. In some embodiments, gate dielectric layers are deposited into the lateral recesses prior to conductive layers 332, such that conductive layers 332 are deposited on the gate dielectric layers. Conductive layers 332, such as metal layers, can be deposited using one or more thin film deposition processes, such as ALD, CVD, PVD, any other suitable processes, or any combination thereof.

Method 400 proceeds to operation 412, as illustrated in FIG. 4, in which a first source contact portion is formed in the slit opening. In some embodiments, to form the first source contact portion, a spacer is formed over a sidewall of the slit opening, a conductive layer is deposited over the spacer in the slit opening, and the conductive layer is etched back in the slit opening. The conductive layer can include polysilicon.

As illustrated in FIG. 3D, a spacer 338 can be formed over the sidewall of slit opening 326. In some embodiments, a doped region (not shown) can be first formed using ion implantation and/or thermal diffusion to dope P-type or N-type dopants into part of silicon substrate 302 exposed through slit opening 326. In some embodiments, etch-back recesses are formed in each conductive layer 332 abutting the sidewall of slit opening 326. The etch-back recesses can be etched-back using wet etching and/or dry etching processes through slit opening 326. Spacer 338 including one or more dielectric layers, such as silicon oxide and silicon nitride, is deposited into the etch-back recesses and along the sidewall of slit opening 326 using one or more thin film deposition processes, such as ALD, CVD, PVD, any other suitable processes, or any combination thereof, according to some embodiments. As illustrated in FIG. 3D, a lower source contact portion 342-1 is formed in the bottom portion of silt opening 326. In some embodiments, a conductive layer including, for example, doped polysilicon, is deposited over spacer 338 in slit opening 326. In some embodiments, an etch-back process is performed to remove part of the conductive layer in the top portion of slit opening 326, leaving lower source contact portion 342-1 in the bottom portion of slit opening 326. For example, polysilicon may be etched back using wet etching and/or dry etching.

Method 400 proceeds to operation 414, as illustrated in FIG. 4, in which a channel local contact opening through the local dielectric layer to expose the channel structure, a staircase local contact opening through the local dielectric layer to expose one of the conductive layers at a staircase structure on an edge of the memory stack, and a peripherical local contact opening extending vertically to the substrate outside of the memory stack, are simultaneously formed. In some embodiments, a hard mask is formed to cover the slit opening prior to the simultaneous formation of the channel local contact opening, staircase local contact opening, and peripherical local contact opening.

Figure 3E:
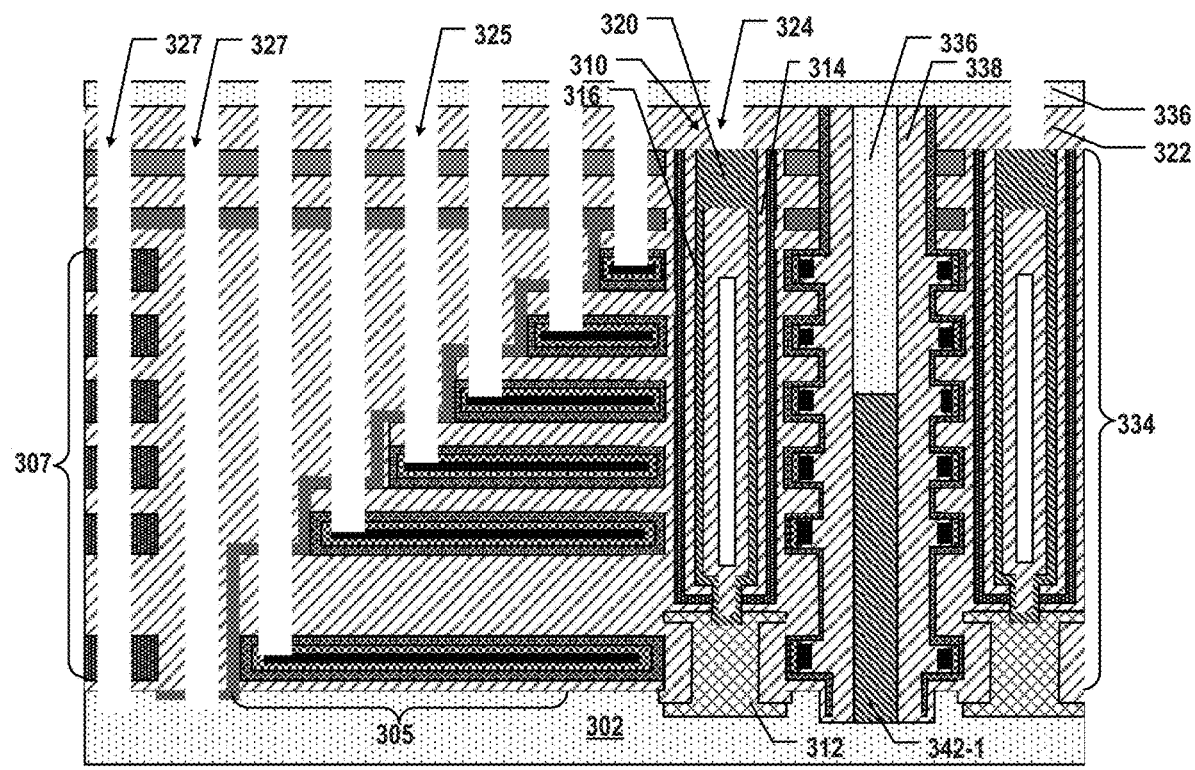
Figure 3E:
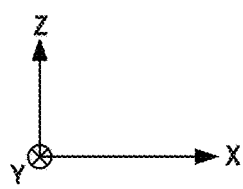
Figure 4:
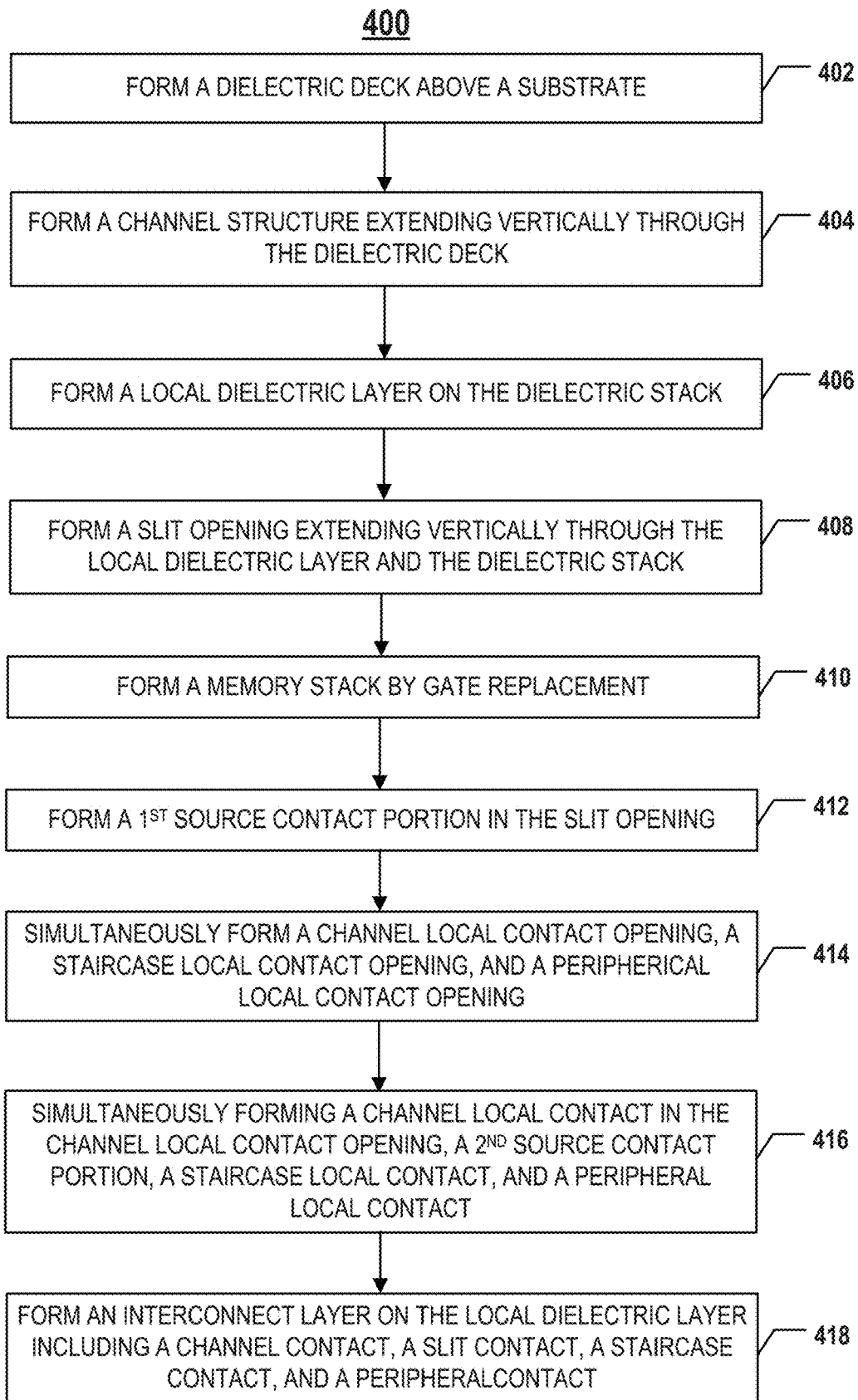
FIG. 4 illustrates a flowchart of a method for forming an exemplary 3D memory device with an interconnect structure, according to some embodiments of the present disclosure.

As illustrated in FIG. 3E, a hard mask 336 is formed on local dielectric layer 322 and in slit opening 326 (shown in FIG. 3D) to cover slit opening 326. Hard mask 336 can be patterned using photolithography, followed by dry etching and/or wet etching processes, to create openings for forming channel local contact openings 324, staircase local contact openings 325, and peripheral local contact openings 327. One or more cycles of drying etching and/or wet etching, such as DRIE, can be performed, through the openings in hard mask 336 to etch channel local contact openings 324, staircase local contact openings 325, and peripheral local contact openings 327 simultaneously in the same etching process. In some embodiments, local dielectric layer 322 is etched through to form channel local contact openings 324, stopping at channel plugs 320 of channel structures 310 to expose channel structures 310, respectively. In some embodiments, local dielectric layer 322 is etched through to form staircase local contact openings 325, stopping at conductive layers 332 (shown in FIG. 3D) at staircase structure 305 on the edge of memory stack 334 to expose conductive layers 332, respectively. In some embodiments, local dielectric layer 322 and the ILD layers outside of memory stack 334 are etched through to form peripheral local contact openings 327, stopping at silicon substrate 302. In some embodiments, the interleaved first and second dielectric layers in barrier structure 307 are etched through as well to form peripheral local contact opening 327 extending vertically through barrier structure 307 to silicon substrate 302.

Method 400 proceeds to operation 416, as illustrated in FIG. 4, in which a channel local contact in the channel local contact opening, a second source contact portion above the first source contact portion in the slit opening, a staircase local contact in the staircase local contact opening, and a peripherical local contact in the peripherical local contact opening are simultaneously formed. In some embodiments, to simultaneously channel local contact, the second source contact portion, the staircase local contact, and the peripheral local contact, a conductive layer is simultaneously deposited in the channel local contact opening, the slit opening, the staircase local contact opening, and the peripheral local contact opening, and the deposited conductive layer is planarized, such that upper ends of the channel local contact, the second source contact portion, the staircase local contact, and the peripheral local contact are flush with one another. The conductive layer can include tungsten.

Figure 3F:
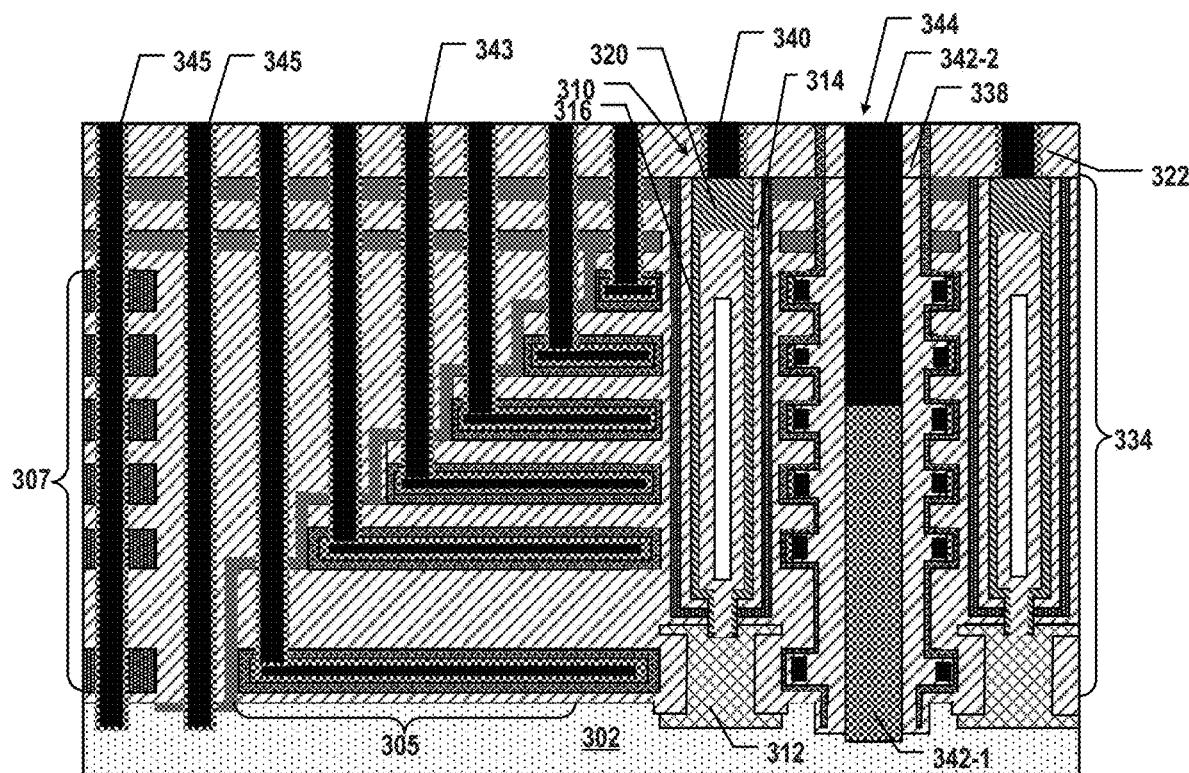

As illustrated in FIG. 3F, hard mask 336 (shown in FIG. 3E) is removed, and channel local contacts 340, upper source contact portion 342-2, staircase local contacts 343, and peripheral local contacts 345 are simultaneously formed. In some embodiments, a conductive layer including, for example, tungsten, is deposited by the same deposition process into channel local contact opening 324 (shown in FIG. 3E), the remaining space of slit opening 326 (shown in FIG. 3D once hard mask 336 is removed), staircase local contact openings 325 (shown in FIG. 3E), and peripheral local contact openings 327 (shown in FIG. 3E) to simultaneously form channel local contacts 340, upper source contact portion 342-2, staircase local contacts 343, and peripheral local contacts 345. The deposition process can include thin film deposition processes, such as ALD, CVD, PVD, any other suitable processes, or any combination thereof. A planarization process, such as CMP, can be performed to remove the excess conductive layer and planarize the deposited conductive layer. The upper ends of channel local contacts 340, upper source contact portion 342-2, staircase local contacts 343, and peripheral local contacts 345 are thus flush with one another, according to some embodiments. A slit structure 344 including source contact 342 (including lower source contact portion 342-1 and upper source contact portion 342-2) and spacer 338 is thereby formed as well.

Method 400 proceeds to operation 418, as illustrated in FIG. 4, in which an interconnect layer is formed on the local dielectric layer. The interconnect layer includes a channel contact above and in contact with the channel local contact, a slit contact above and in contact with the second source contact portion, a staircase contact above and in contact with the staircase local contact; and a peripheral contact above and in contact with the peripheral local contact. In some embodiments, to form the interconnect layer, another dielectric layer is formed on the local dielectric layer. In some embodiments, to form the interconnect layer, a channel contact opening through the another dielectric layer to expose the channel local contact, a slit contact opening through the another dielectric layer to expose the second source contact portion, a staircase contact opening through the another dielectric layer to expose the staircase local contact, and a peripheral contact opening through the another dielectric layer to expose the peripheral local contact are simultaneously formed. In some embodiments, to form the interconnect layer, a channel local contact in the channel local contact opening, a second source contact portion above the first source contact portion in the slit opening, and a staircase local contact in the staircase local contact opening are simultaneously formed.

Figure 3G:
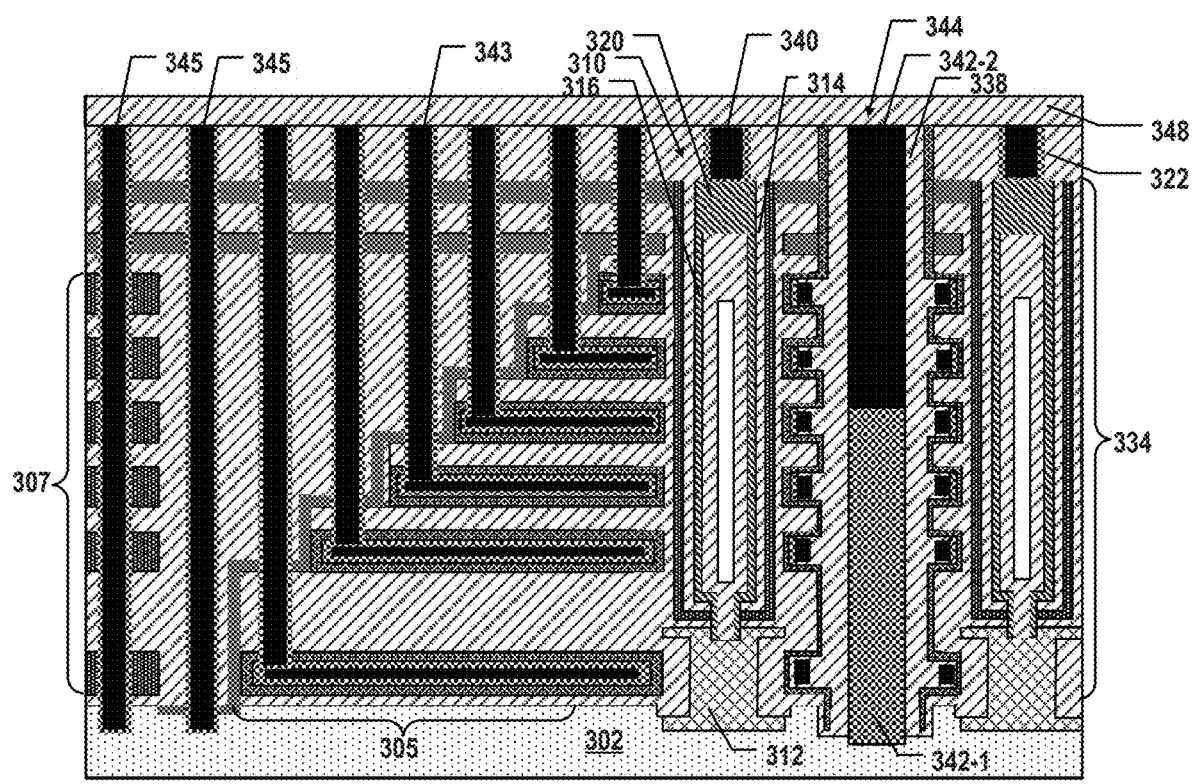

As illustrated in FIG. 3G, a dielectric layer 348 is formed on local dielectric layer 322. Dielectric layer 348 can be formed by depositing dielectric materials, such as silicon oxide and/or silicon nitride, using one or more thin film deposition processes, such as CVD, PVD, ALD, or any combination thereof, on top of the top surface of local dielectric layer 322. A slit contact opening, channel contact openings, staircase contact openings, and peripheral contact openings are simultaneously formed through dielectric layer 348 using the same etching process. In some embodiments, the etching process etches the channel contact openings through dielectric layer 348 stopping at the upper ends of channel local contacts 340 to expose the upper end of channel local contact 340, respectively. In some embodiments, the same etching process etches also etches the slit contact opening through dielectric layer 348 stopping at the upper end of slit structure 344 to expose the upper end of slit structure 344. In some embodiments, the same etching process also etches the staircase contact openings through dielectric layer 348 stopping at the upper ends of staircase local contacts 343 to expose the upper end of staircase local contacts 343, respectively. In some embodiments, the same etching process also etches the peripheral contact openings through dielectric layer 348 stopping at the upper ends of peripheral local contacts 345 to expose the upper end of staircase local contacts 343, respectively. The etching process can include one or more cycles of wet etching and/or dry etching. The channel contact openings, staircase contact openings, peripheral contact openings, and slit contact opening can be patterned by an etching mask (e.g., photoresist) using photolithography, such that the channel contact openings, staircase contact openings, peripheral contact openings, and slit contact opening are aligned with channel local contacts 340, staircase local contacts 343, peripheral local contacts 345, and upper source contact portion 342-2 of slit structure 344, respectively.

Figure 3H:
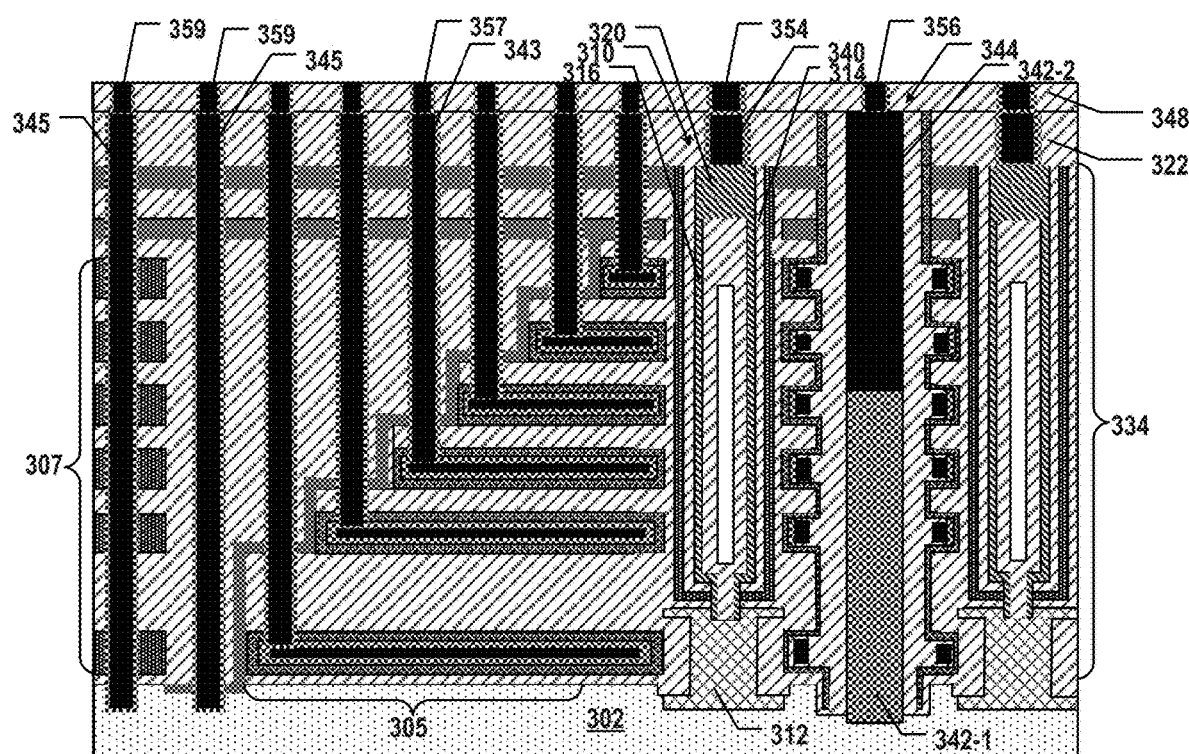
Figure 3H:
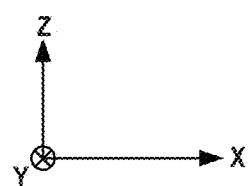

As illustrated in FIG. 3H, a conductive layer including, for example, tungsten, is deposited by the same deposition process into the channel contact opening, slit contact opening, staircase contact openings, and peripheral contact openings to simultaneously form channel contacts 354, slit contact 356, staircase contacts 357, and peripheral contacts 359. An interconnect layer including channel contacts 354, slit contact 356, staircase contacts 357, and peripheral contacts 359 is thereby formed. A planarization process, such as CMP, can be performed to remove the excess conductive layer and planarize the deposited conductive layer. The upper ends of channel contacts 354, slit contact 356, staircase contacts 357, and peripheral contacts 359 are thus flush with one another, according to some embodiments.

According to one aspect of the present disclosure, a 3D memory device includes a substrate, a memory stack, a channel structure, a channel local contact, a slit structure, and a staircase local contact. The memory stack includes interleaved conductive layers and dielectric layers above the substrate. The channel structure extends vertically through the memory stack. The channel local contact is above and in contact with the channel structure. The slit structure extends vertically through the memory stack. The staircase local contact is above and in contact with one of the conductive layers at a staircase structure on an edge of the memory stack. Upper ends of the channel local contact, the slit structure, and the staircase local contact are flush with one another.

In some embodiments, the 3D memory device further includes channel contact above and in contact with the upper end of the channel local contact, a slit contact above and in contact with the upper end of the slit structure, and a staircase contact above and in contact with the upper end of the staircase local contact. Upper ends of the channel contact, the slit contact, and the staircase contact are flush with one another, according to some embodiments.

In some embodiments, the channel contact, the slit contact, and the staircase contact have a same depth and include a same conductive material.

In some embodiments, the slit structure includes a source contact including a first source contact portion and a second source contact portion above the first source contact portion and has a different material of the first source contact portion, and a spacer laterally between the source contact of the slit structure and the conductive layers of the memory stack.

In some embodiments, the second source contact portion, the channel local contact, and the staircase local contact include a same conductive material.

In some embodiments, the first source contact portion includes polysilicon, and the second source contact portion, the channel local contact, and the staircase local contact include a same metal. The metal can include tungsten.

In some embodiments, the channel structure includes a semiconductor channel and a memory film. In some embodiments, the channel structure further includes a channel plug in a top portion of the channel structure and in contact with the channel local contact.

In some embodiments, the 3D memory device further includes a peripherical local contact extending vertically to the substrate outside of the memory stack. An upper end of the peripherical local contact is flush with the upper ends of the channel local contact, the slit structure, and the staircase local contact, according to some embodiments.

In some embodiments, the 3D memory device further includes a barrier structure comprising interleaved first dielectric layers and second dielectric layers. The peripheral local contact extends vertically through the barrier structure, according to some embodiments.

According to another aspect of the present disclosure, a 3D memory device includes a substrate, a memory stack, a channel structure, a channel local contact, a slit structure, and a peripherical local contact. The memory stack includes interleaved conductive layers and dielectric layers above the substrate. The channel structure extends vertically through the memory stack. The channel local contact is above and in contact with the channel structure. The slit structure extends vertically through the memory stack. The peripherical local contact extends vertically to the substrate outside of the memory stack. Upper ends of the channel local contact, the slit structure, and the peripherical local contact are flush with one another.

In some embodiments, the 3D memory device further includes channel contact above and in contact with the upper end of the channel local contact, a slit contact above and in contact with the upper end of the slit structure, and a peripherical contact above and in contact with the upper end of the peripherical local contact. Upper ends of the channel contact, the slit contact, and the peripherical contact are flush with one another, according to some embodiments.

In some embodiments, the channel contact, the slit contact, and the peripherical contact have a same depth and include a same conductive material.

In some embodiments, the slit structure includes a source contact including a first source contact portion and a second source contact portion above the first source contact portion and has a different material of the first source contact portion, and a spacer laterally between the source contact of the slit structure and the conductive layers of the memory stack.

In some embodiments, the second source contact portion, the channel local contact, and the peripherical local contact include a same conductive material.

In some embodiments, the first source contact portion includes polysilicon, and the second source contact portion, the channel local contact, and the peripherical local contact include a same metal. The metal can include tungsten.

In some embodiments, the channel structure includes a semiconductor channel and a memory film. In some embodiments, the channel structure further includes a channel plug in a top portion of the channel structure and in contact with the channel local contact.

In some embodiments, the 3D memory device further includes a staircase local contact above and in contact with one of the conductive layers at a staircase structure on an edge of the memory stack. An upper end of the staircase local contact is flush with the upper ends of the channel local contact, the slit structure, and the peripherical local contact, according to some embodiments.

In some embodiments, the 3D memory device further includes a barrier structure comprising interleaved first dielectric layers and second dielectric layers. The peripheral local contact extends vertically through the barrier structure, according to some embodiments.

In some embodiments, the peripheral local contact is a vertical interconnect access (via) contact.

According to still another aspect of the present disclosure, a method for forming a 3D memory device is disclosed. Channel structure extending vertically through a dielectric stack including interleaved sacrificial layers and dielectric layers is formed above a substrate. A local dielectric layer is formed on the dielectric stack. A slit opening extending vertically through the local dielectric layer and the dielectric stack is formed. A memory stack including interleaved conductive layers and the dielectric layers is formed by replacing, through the slit opening, the sacrificial layers with the conductive layers. A first source contact portion is formed in the slit opening. A channel local contact opening through the local dielectric layer to expose the channel structure, and a staircase local contact opening through the local dielectric layer to expose one of the conductive layers at a staircase structure on an edge of the memory stack are simultaneously formed. A channel local contact in the channel local contact opening, a second source contact portion above the first source contact portion in the slit opening, and a staircase local contact in the staircase local contact opening are simultaneously formed.

In some embodiments, to simultaneously form the channel local contact opening and the staircase local contact opening, (i) the channel local contact opening, (ii) the staircase local contact opening, and (iii) a peripherical local contact opening extending vertically to the substrate outside of the memory stack are simultaneously formed. In some embodiments, to simultaneously form the channel local contact, the second source contact portion, and the staircase local contact further comprises, (i) the channel local contact, (ii) the second source contact portion, (iii) the staircase local contact, and (iv) a peripherical local contact in the peripherical local contact opening are simultaneously formed.

In some embodiments, an interconnect layer is formed on the local dielectric layer. The interconnect layer can include (i) a channel contact above and in contact with the channel local contact, (ii) a slit contact above and in contact with the second source contact portion, (ii) a staircase contact above and in contact with the staircase local contact; and (iv) a peripheral contact above and in contact with the peripheral local contact.

In some embodiments, to form the interconnect layer, (i) a channel contact opening through the another dielectric layer to expose the channel local contact, (ii) a slit contact opening through the another dielectric layer to expose the second source contact portion, (iii) a staircase contact opening through the another dielectric layer to expose the staircase local contact, and (iv) a peripheral contact opening through the another dielectric layer to expose the peripheral local contact are simultaneously formed, a conductive layer is simultaneously deposited into the channel contact opening, the slit contact opening, the staircase contact opening, and the peripheral contact opening, and the deposited conductive layer is planarized, such upper ends of the channel contact, the slit contact, the staircase contact, and the peripheral contact are flush with one another.

In some embodiments, to simultaneously form the channel local contact, the second source contact portion, and the staircase local contact, a conductive layer is simultaneously deposited in the channel local contact opening, the slit opening, the staircase local contact opening, and the peripheral local contact opening, and the deposited conductive layer is planarized, such that upper ends of the channel local contact, the second source contact portion, the staircase local contact, and the peripheral local contact are flush with one another. In some embodiments, the conductive layer includes tungsten.

In some embodiments, to form the channel structure, a channel hole extending vertically through the dielectric stack is etched, a memory film and a semiconductor channel are subsequently formed over a sidewall of the channel hole, and a channel plug is formed above and in contact with the semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack comprising interleaved conductive layers and dielectric layers above the substrate;
a channel structure extending vertically through the memory stack;
a channel local contact above and in contact with the channel structure, and a channel contact above and in contact with an upper end of the channel local contact;
a slit structure extending vertically through the memory stack and comprising a source contact that comprises a first source contact portion and a second source contact portion above the first source contact portion, the first source contact portion and the second source contact portion comprising different materials; and
a staircase local contact above and in contact with one of the conductive layers at a staircase structure on an edge of the memory stack, and a staircase contact above and in contact with an upper end of the staircase local contact,
wherein:
an upper end of the channel local contact, an upper end of the second source contact portion, and an upper end of the staircase local contact are flush with one another;
the upper end of the second source contact portion is in direct contact with a slit contact; and
the channel contact, the slit contact, and the staircase contact are within a same layer.

2. The 3D memory device of claim 1, wherein upper ends of the channel contact, the slit contact, and the staircase contact are flush with one another.

3. The 3D memory device of claim 1, wherein the channel contact, the slit contact, and the staircase contact have a same depth and comprise a same conductive material.

4. The 3D memory device of claim 1, wherein the slit structure comprises:
a spacer laterally between the source contact of the slit structure and the conductive layers of the memory stack.

5. The 3D memory device of claim 1, wherein the second source contact portion, the channel local contact, and the staircase local contact comprise a same conductive material.

6. The 3D memory device of claim 5, wherein:
the first source contact portion comprises polysilicon; and
the second source contact portion, the channel local contact, and the staircase local contact comprise a same metal.

7. The 3D memory device of claim 6, wherein the metal comprises tungsten.

8. The 3D memory device of claim 1, wherein the channel structure comprises a semiconductor channel, a memory film, and a channel plug in a top portion of the channel structure and in contact with the channel local contact.

9. The 3D memory device of claim 1, further comprising a peripheral local contact extending vertically to a substrate outside of the memory stack, wherein an upper end of the peripheral local contact is flush with the upper ends of the channel local contact, the slit structure, and the staircase local contact.

10. The 3D memory device of claim 9, further comprising a barrier structure comprising interleaved first dielectric layers and second dielectric layers, wherein the peripheral local contact extends vertically through the barrier structure.

11. A three-dimensional (3D) memory device, comprising:
- a substrate;
- a memory stack comprising interleaved conductive layers and dielectric layers above the substrate;
- a channel structure extending vertically through the memory stack;
- a channel local contact above and in contact with the channel structure, and a channel contact above and in contact with an upper end of the channel local contact;
- a slit structure extending vertically through the memory stack and comprising a source contact that comprises a first source contact portion and a second source contact portion above the first source contact portion, the first source contact portion and the second source contact portion comprising different materials; and
- a peripheral local contact extending vertically to the substrate outside of the memory stack, and a peripheral contact above and in contact with an upper end of the peripheral local contact, wherein:
- an upper end of the channel local contact, an upper end of the second source contact portion, and an upper end of the peripheral local contact are flush with one another;
- the upper end of the second source contact portion is in direct contact with a slit contact; and
- the channel contact, the slit contact, and the peripheral contact are within a same layer.

12. The 3D memory device of claim 11, wherein upper ends of the channel contact, the slit contact, and the peripheral contact are flush with one another.

13. The 3D memory device of claim 11, wherein the channel contact, the slit contact, and the peripheral contact have a same depth and comprise a same conductive material.

14. The 3D memory device of claim 11, wherein the slit structure comprises:
- a spacer laterally between the source contact of the slit structure and the conductive layers of the memory stack.

15. The 3D memory device of claim 11, wherein the second source contact portion, the channel local contact, and the peripheral local contact comprise a same conductive material.

16. The 3D memory device of claim 15, wherein:
- the first source contact portion comprises polysilicon; and
- the second source contact portion, the channel local contact, and the peripheral local contact comprise a same metal.

17. The 3D memory device of claim 11, further comprising a staircase local contact above and in contact with one of the conductive layers at a staircase structure on an edge of the memory stack, wherein an upper end of the staircase local contact is flush with the upper ends of the channel local contact, the slit structure, and the peripheral local contact.

18. The 3D memory device of claim 17, further comprising a barrier structure comprising interleaved first dielectric layers and second dielectric layers, wherein the peripheral local contact extends vertically through the barrier structure.

19. The 3D memory device of claim 11, wherein the peripheral local contact is a vertical interconnect access (via) contact.

20. The 3D memory device of claim 11, wherein the channel structure comprises a semiconductor channel, a memory film, and a channel plug in a top portion of the channel structure and in contact with the channel local contact.

* * * * *